United States Patent
Peng et al.

(10) Patent No.: US 9,116,581 B2
(45) Date of Patent: Aug. 25, 2015

(54) EDGE ACCURACY IN A CAPACITIVE SENSE ARRAY

(75) Inventors: Tao Peng, Starkville, MS (US); Min Chin Chai, Lynnwood, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 565 days.

(21) Appl. No.: 13/223,702

(22) Filed: Sep. 1, 2011

(65) Prior Publication Data

US 2013/0049771 A1  Feb. 28, 2013

Related U.S. Application Data

(63) Continuation of application No. PCT/US2011/048908, filed on Aug. 24, 2011.

(51) Int. Cl.
*G01R 27/26* (2006.01)
*G06F 3/044* (2006.01)
*G06F 3/041* (2006.01)

(52) U.S. Cl.
CPC .............. *G06F 3/044* (2013.01); *G06F 3/0418* (2013.01); *G01R 27/2605* (2013.01)

(58) Field of Classification Search
CPC .... G06F 3/0488; G06F 3/044; G01R 27/2605
USPC .................... 178/18.06, 19.03; 324/658–690; 341/33; 345/173, 174
See application file for complete search history.

(56) References Cited

U.S. PATENT DOCUMENTS

| RE34,741 E * | 9/1994 | Andermo ...................... 324/690 |
| 7,864,160 B2 | 1/2011 | Geaghan et al. |
| 2002/0039092 A1* | 4/2002 | Shigetaka ..................... 345/156 |
| 2005/0270039 A1* | 12/2005 | Mackey ........................ 324/660 |
| 2007/0074914 A1* | 4/2007 | Geaghan et al. ........... 178/18.06 |
| 2010/0007628 A1* | 1/2010 | Eriguchi et al. .............. 345/174 |
| 2010/0026660 A1* | 2/2010 | Kitamura ..................... 345/174 |
| 2011/0175834 A1* | 7/2011 | Han et al. ..................... 345/173 |

FOREIGN PATENT DOCUMENTS

| JP | 09160710 A | | 6/1997 |
| KR | 20110083957 A | * | 7/2011 |
| KR | 1055049 B1 | | 8/2011 |

OTHER PUBLICATIONS

International Search Report for International Application No. PCT/US2011/48908 dated Apr. 10, 2012; 3 pages.
Written Opinion of the International Searching Authority for International Application No. PCT/US2011/048908 mailed Apr. 10, 2012; 4 pages.

* cited by examiner

*Primary Examiner* — Melissa Koval
*Assistant Examiner* — Daniel Miller

(57) ABSTRACT

A capacitive sense array configured to improve edge accuracy in detecting a presence of a conductive object is described. In one embodiment, a capacitive sense array includes at least a first set of sense elements having non-homogenous pitches disposes in a first longitudinal axis of the capacitive sense array. The pitch includes width of the sense elements and spacing between the sense elements.

17 Claims, 11 Drawing Sheets

900
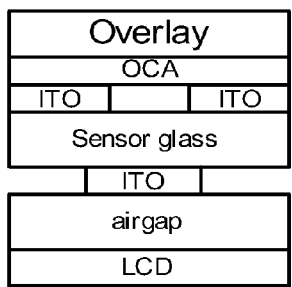
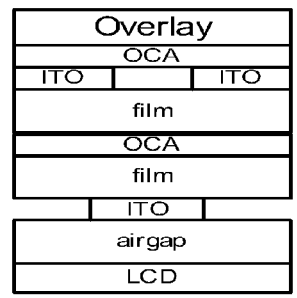
Fig. 9A
Fig. 9B
Fig. 9C

EDGE ACCURACY IN A CAPACITIVE SENSE ARRAY

RELATED APPLICATIONS

This application claims the benefit of PCT/US11/48908, IP/US filed on 24 Aug. 2011.

TECHNICAL FIELD

This disclosure relates to the field of user interface devices and, in particular, to capacitive sense devices.

BACKGROUND

Capacitive sense arrays may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can be arranged in the form of a capacitive sense array for a touch-sensing surface. When a conductive object, such as a finger, comes in contact or close proximity with the touch-sensing surface, the capacitance of one or more capacitive touch sense elements changes. The capacitance changes of the capacitive touch sense elements can be measured by an electrical circuit. The electrical circuit converts the measured capacitances of the capacitive sense elements into digital values.

Transparent touch screens that utilize capacitive sense arrays are ubiquitous in today's industrial and consumer markets. They can be found on cellular phones, GPS devices, cameras, computer screens, MP3 players, digital tablets, and the like. In contemporary cellular phones and smart phones, touch screen area is of significant concern to manufacturers given the small amount of space available for user interaction. As such, manufacturers seek a touch screen that maximizes its useable area while maintaining uniform position tracking accuracy. However, conventional designs exhibit considerable position tracking error near the edges of the touch screen.

FIG. 1 illustrates a conventional pattern design of a capacitance sense array panel 100 having homogenous width stripes or sense elements. The capacitance sense array panel 100 comprising an N×M sense element matrix which includes transmission ("Tx") sense element 102 and receive ("Rx") sense elements 104. The transmission and receive sense elements in the N×M sense element matrix are arranged so that each of the transmission sense elements intersects each of the receive sense elements. Thus, each transmission sense element is capacitively coupled with each of the receive sense elements. For example, transmission sense element 102 is capacitively coupled with receive sense element 104 at the point where transmission sense element 102 and receive sense element 104 intersect. The intersection of the transmission sense element 102 and the receive sense element 104 is called a sense element. It is noted that the embodiment disclosed in FIG. 1, the orientation of the axes of Tx sense elements may be switched with the Rx sense elements as would be appreciated by one of ordinary skill in the art having the benefit of this disclosure.

Because of the capacitive coupling between the transmit and receive sense elements, a Tx signal (not shown) applied to each transmit sense element induces a current at each of the receive sense elements. For instance, when a Tx signal is applied to transmission sense element 102, the Tx signal induces an Rx signal (not shown) on the receive sense element 104. When a conductive object, such as a finger, approaches the N×M sense element matrix, the object will modulate the signal by changing the mutual capacitance at the junction, or the intersect point between the Tx and Rx sense elements. Since a finger would normally activate about three to five neighboring junctions, a signal profile can be readily obtained. Finger location can therefore be determined by the distribution of this profile using a centroid algorithm.

As shown in FIG. 1, the Tx sense elements 102 and Rx sense elements 104 have sensor widths which are uniformly across the panel. These are referred to as homogenous width sense elements. One problem with this conventional design is that accuracy variation between a center area and an edge area. The edge area is often defined as within one sensor pitch from the physical edge of the touch panel, and elsewhere is called center area. The dimension of sensor pitch is typically the width of one sense element. In touch panel applications, accuracy is defined as error between the location of a conductive object on or in proximity to the touch panel and the location sensed by the touch panel. Conventionally, accuracy within the center area is significantly greater than the accuracy within the edge area. For example, the accuracy of this pattern along the edges of the conventional capacitive sense array is often at least three times worse than the accuracy in the central area of the array. The major reason for this significant difference in accuracy is that with the finger landing on an edge sensor causes a signal profile to be chopped off at the edge of the panel. So, without a complete signal profile, the centroid determination of the finger would certainly have some error in the centroid algorithm since the information is unbalanced, resulting in systematic centroid offset along the edges of the panel.

BRIEF DESCRIPTION OF THE DRAWINGS

The present invention is illustrated by way of example, and not of limitation, in the figures of the accompanying drawings in which:

FIG. 9A-9C illustrate embodiments of assembled layer structures of the mutual capacitive sense array.

DETAILED DESCRIPTION

A capacitive sense array configured to improve edge accuracy in detecting a presence of a conductive object is described. In one embodiment, a capacitive sense array includes at least a first set of sense elements having non-homogenous pitches disposed in a first longitudinal axis of the capacitive sense array. The pitch as defined in the present invention includes width of the sense elements and spacing between the sense elements.

The embodiments described herein are configured to improve edge accuracy of the capacitive sense array.

As described above, in touch panel applications, accuracy is defined as error between the location of a conductive object on or in proximity to the touch panel and the location sensed by the touch panel. The sensed, or calculated location is based on the overall signal magnitude and profile of the presence of the conductive object detected by the capacitive sense circuitry. For example, a single finger touch generates signals across a neighborhood of sense elements, which create a signal profile. Signal degradation or a deformed signal profile causes accuracy problems, including the variations in the accuracy between the center area of the touch panel and an edge area. As described above, the edge area is often defined as within one sensor pitch from the physical edge of the touch panel, and elsewhere is called center area. The accuracy within the center area is significantly than the edge area, e.g., the accuracy at the center area is approximately 0.5 mm as compared to approximately 1.5 mm accuracy at the edge area (about at least three times worse). The embodiments described herein improve the accuracy within the edge area.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Figure 1:
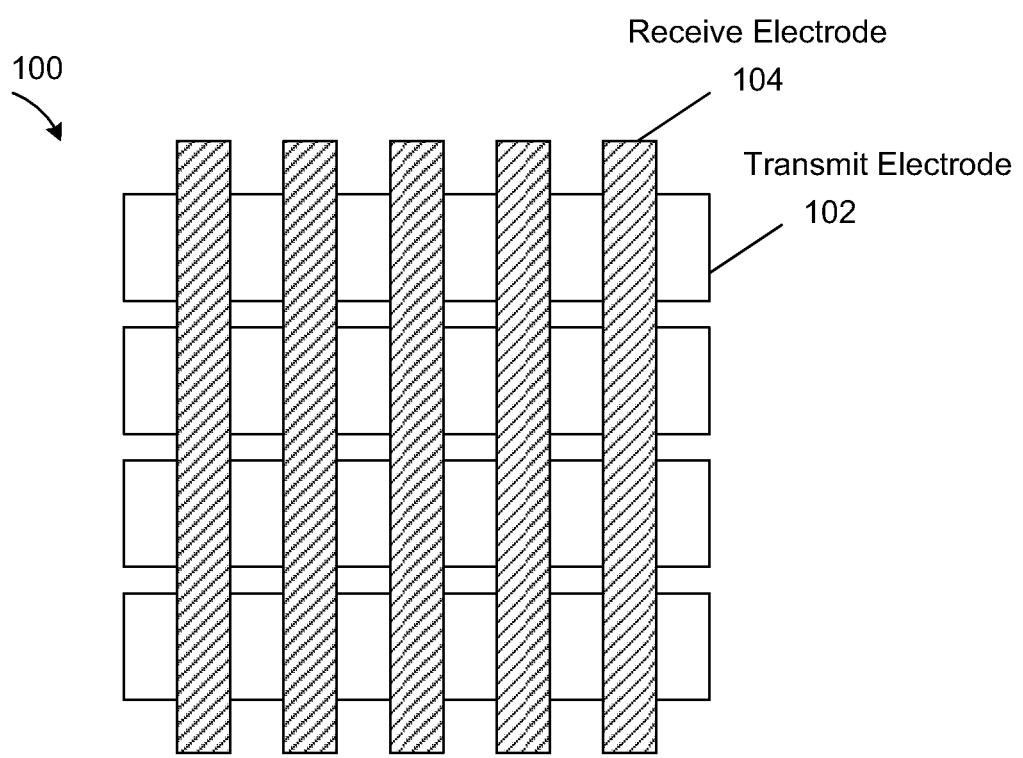
FIG. 1 illustrates a conventional design of mutual capacitive sense array having homogenous width stripes.
Figure 2:
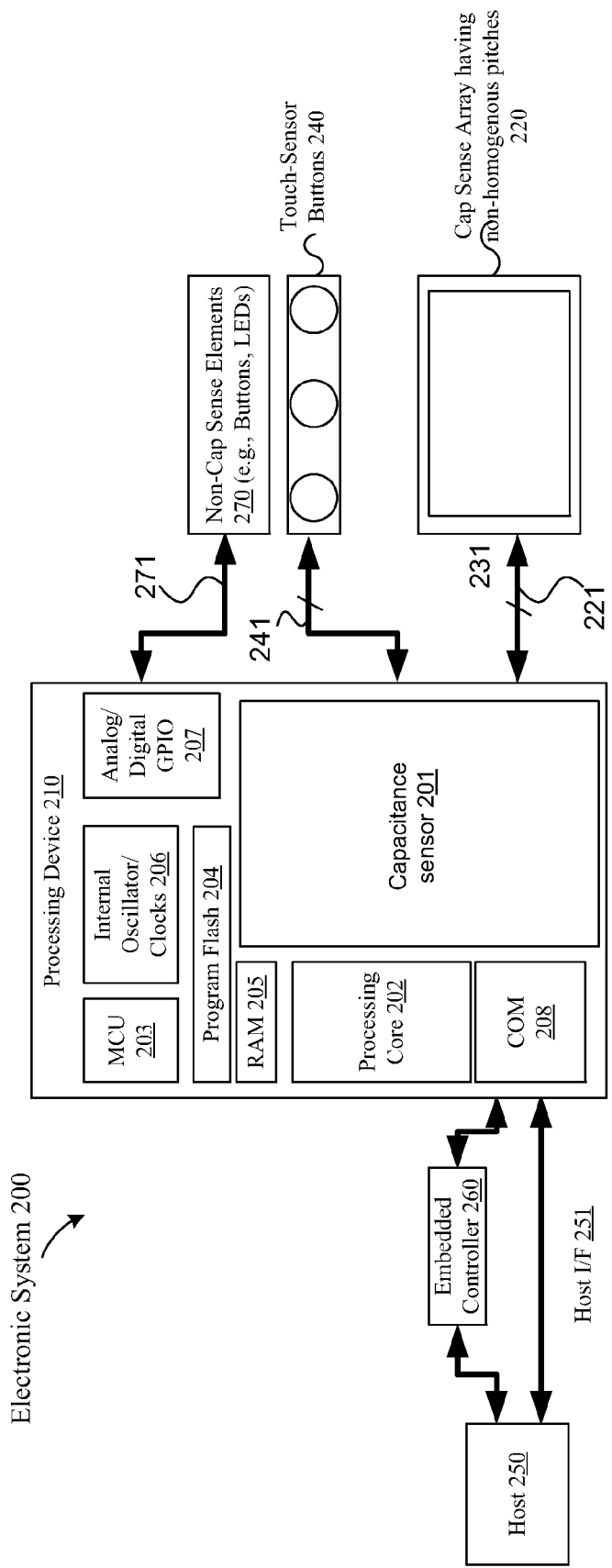
FIG. 2 illustrates a block diagram illustrating one embodiment of an electronic system having a processing device for detecting a presence of a conductive object on a capacitive sense array having sense elements with non-homogenous pitches according to embodiments of the present invention.

FIG. 2 is a block diagram illustrating one embodiment of an electronic system 200 having a processing device for detecting a presence of a conductive object on a capacitive sense array 220 having non-homogenous pitches according to embodiments of the present invention. Electronic system 200 includes processing device 210, capacitive sense array having non-homogenous pitches 220, touch-sense buttons 240, host processor 250, embedded controller 260, and non-capacitance sense elements 270. The processing device 210 may include analog and/or digital general purpose input/output ("GPIO") ports 207. GPIO ports 207 may be programmable. GPIO ports 207 may be coupled to a Programmable Interconnect and Logic ("PIL"), which acts as an interconnect between GPIO ports 207 and a digital block array of the processing device 210 (not shown). The digital block array may be configured to implement a variety of digital logic circuits (e.g., DACs, digital filters, or digital control systems) using, in one embodiment, configurable user modules ("UMs"). The digital block array may be coupled to a system bus. Processing device 210 may also include memory, such as random access memory ("RAM") 205 and program flash 204. RAM 205 may be static RAM ("SRAM"), and program flash 204 may be a non-volatile storage, which may be used to store firmware (e.g., control algorithms executable by processing core 202 to implement operations described herein). Processing device 210 may also include a microcontroller unit ("MCU") 203 coupled to memory and the processing core 202.

The processing device 210 may also include an analog block array (not shown). The analog block array is also coupled to the system bus. Analog block array also may be configured to implement a variety of analog circuits (e.g., ADCs or analog filters) using, in one embodiment, configurable UMs. The analog block array may also be coupled to the GPIO ports 207.

As illustrated, capacitance sensor 201 may be integrated into processing device 210. Capacitance sensor 201 may include analog I/O for coupling to an external component, such as capacitive sense array having non-homogenous pitches 220, touch-sense buttons 240, and/or other devices. Capacitance sensor 201 and processing device 210 are described in more detail below.

The embodiments described herein can be used in any capacitive sense array application, for example, the capacitive sense array having non-homogenous pitches 220 may be a touch screen, a touch-sense slider, or touch-sense buttons 240 (e.g., capacitance sense buttons). In one embodiment, these sense devices may include one or more capacitive sense elements. The operations described herein may include, but are not limited to, notebook pointer operations, lighting control (dimmer), volume control, graphic equalizer control, speed control, or other control operations requiring gradual or discrete adjustments. It should also be noted that these embodiments of capacitive sense implementations may be used in conjunction with non-capacitive sense elements 270, including but not limited to pick buttons, sliders (ex. display brightness and contrast), scroll-wheels, multi-media control (ex. volume, track advance, etc) handwriting recognition and numeric keypad operation.

In one embodiment, the electronic system 200 includes a capacitive sense array of sense elements having non-homogenous pitches 220 coupled to the processing device 210 via bus 221. The capacitive sense array of the sense elements having non-homogenous pitches 220 may include a one-dimensional sense array in one embodiment and a two dimensional sense array in another embodiment. Alternatively, the capacitive sense array of the sense elements having non-homogenous pitches 220 may have more dimensions. Also, in one embodiment, the capacitive sense array of the sense elements having non-homogenous pitches 220 may be sliders, touchpads, touch screens or other sensing devices. In another embodiment, the electronic system 200 includes touch-sense buttons 240 coupled to the processing device 210 via bus 241. Touch-sense buttons 240 may include a single-dimension or multi-dimension sense array. The single- or multi-dimension sense array may include multiple sense elements. For a touch-sense button, the sense elements may be coupled together to detect a presence of a conductive object over the entire surface of the sense device. Alternatively, the touch-sense buttons 240 may have a single sense element to detect the presence of the conductive object. In one embodiment, touch-sense buttons 240 may include a capacitive sense element. Capacitive sense elements may be used as non-contact sense elements. These sense elements, when protected by an insulating layer, offer resistance to severe environments.

The electronic system 200 may include any combination of one or more of the capacitive sense array having non-homogenous pitches 220, and/or touch-sense button 240. In another embodiment, the electronic system 200 may also include non-capacitance sense elements 270 coupled to the processing device 210 via bus 271. The non-capacitance sense elements 270 may include buttons, light emitting diodes ("LEDs"), and other user interface devices, such as a mouse, a keyboard, or other functional keys that do not require capacitance sensing. In one embodiment, busses 271, 241, 231, and 221 may be a single bus. Alternatively, these buses may be configured into any combination of one or more separate buses.

Processing device 210 may include internal oscillator/clocks 206 and communication block ("COM") 208. The oscillator/clocks block 206 provides clock signals to one or more of the components of processing device 210. Communication block 208 may be used to communicate with an external component, such as a host processor 250, via host interface ("I/F") line 251. Alternatively, processing device 210 may also be coupled to the embedded controller 260 to communicate with the external components, such as host processor 250. In one embodiment, the processing device 210 is configured to communicate with the embedded controller 260 or the host processor 250 to send and/or receive data.

Processing device 210 may reside on a common carrier substrate such as, for example, an integrated circuit ("IC") die substrate, a multi-chip module substrate, or the like. Alternatively, the components of processing device 210 may be one or more separate integrated circuits and/or discrete components. In one exemplary embodiment, processing device 210 may be the Programmable System on a Chip ("PSoC®") processing device, developed by Cypress Semiconductor Corporation, San Jose, Calif. Alternatively, processing device 210 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to a host, but may include a system that measures the capacitance on the sense device and sends the raw data to a host computer where it is analyzed by an application. In effect the processing that is done by processing device 210 may also be done in the host.

It is noted that the processing device 210 of FIG. 2 may measure capacitance using various techniques, such as self-capacitance sensing and mutual capacitance sensing. The self-capacitance sensing mode is also called single-electrode sensing mode, as each sensor element needs only one connection wire to the sensing circuit. For the self-capacitance sensing mode, touching the sensor element increases the sensor capacitance as added by the finger touch capacitance is added to the sensor capacitance. The mutual capacitance change is detected in the mutual capacitance-sensing mode. Each sensor element uses at least two electrodes: one is a transmitter (TX) electrode (also referred to herein as transmitter electrode) and the other is a receiver (RX) electrode. When a finger touches a sensor element or is in close proximity to the sensor element, the capacitive coupling between the receiver and the transmitter of the sensor element is decreased as the finger shunts part of the electric field to ground (e.g., chassis or earth).

Capacitance sensor 201 may be integrated into the IC of the processing device 210, or alternatively, in a separate IC. The capacitance sensor 201 may include relaxation oscillator (RO) circuitry, a sigma delta modulator (also referred to as CSD) circuitry, charge transfer circuitry, charge accumulation circuitry, or the like, for measuring capacitance as would be appreciated by one of ordinary skill in the art having the benefit of this disclosure. Alternatively, descriptions of capacitance sensor 201 may be generated and compiled for incorporation into other integrated circuits. For example, behavioral level code describing capacitance sensor 201, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 201.

It should be noted that the components of electronic system 200 may include all the components described above. Alternatively, electronic system 200 may include only some of the components described above.

In one embodiment, electronic system 200 is used in a notebook computer. Alternatively, the electronic device may be used in other applications, such as a mobile handset, a personal data assistant ("PDA"), a keyboard, a television, a remote control, a monitor, a handheld multi-media device, a handheld video player, a handheld gaming device, or a control panel.

Figure 3:
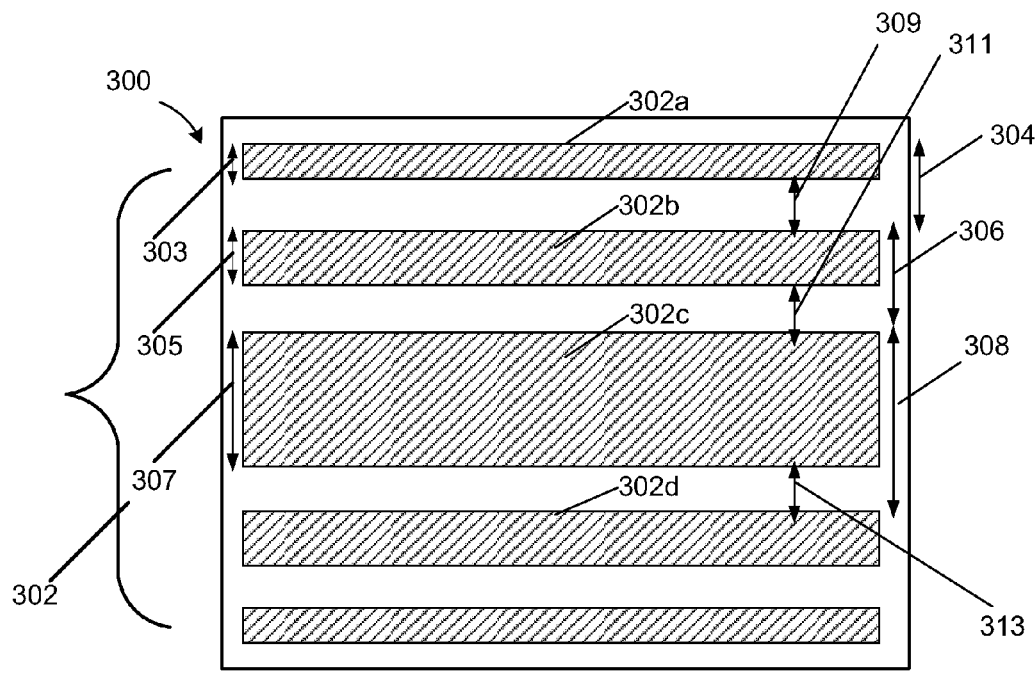
FIG. 3 illustrates a plan view of one embodiment of a capacitive sense array of sense elements having non-homogenous pitches with varied widths of the sense elements.

FIG. 3 illustrates an exemplary plan view of a one embodiment of capacitive sense array 300 of sense elements 302 having non-homogenous pitches disposed in a first longitudinal axis of the capacitance sense array 300. As described above, pitch in the present invention is defined as the width of the sense elements and spacing between the sense elements. As an example, pitch 304 in FIG. 3 is illustrated as the distance from the right edge of the sense element 302a to the same right edge of the sense element 302b. Similarly, pitch 306 is shown as the distance from the right edge of the sense element 302b to the same right edge of the sense element 302c and pitch 308 is shown as the distance from the right edge of sense element 302c to the right edge of the send element 302d. It is noted that the pitch 304 may include the distance from the left edge of the sense element 302a to the same left edge of the sense element 302b. Also, it is noted that the pitch 304 may include the distance from center of the sense element 302a to the center of the sense element 302b (including the spacing between the sense elements 302a and 302b). Specifically, the non-homogenous pitch sense elements 302 are situated in the horizontal axis and the pitches of the non-homogenous sense elements 302 gradually decrease as they are disposed towards the edges of the capacitance sense array 300. The pitches of the non-homogenous sense elements 302 (i.e. sense element pitch) disposed along the edge of the capacitance sense array 300 are smaller; while the sense element pitch of the sense elements closer to the center area of the capacitance sense array 300 are comparatively bigger. This is due to the fact that the widths of the sense elements 302 closer to the edges are smaller than the widths of the sense elements closer to the center area of the capacitance sense array, while the spacing (309, 311 and 313) between the sense elements remain the same in the embodiment illustrated n FIG. 3. For example, width 307 of a center sense element 302c disposed at the center area of the capacitance sense array 300 may be in the range of 30-40 μm, the width 305 of an inner sense element 302b disposed closer to the center area of the capacitance sense array 300 may be in the range of 150-200 μm and the width 303 of an edge sense element 302a disposed closer along the edge of the capacitance sense array 300 may be in the range of 5-10 μm. Alternatively, other dimensions of the widths may be used as would be appreciated by one of ordinary skill in the art having the benefit of this disclosure. The spacing 309 between the sense element 302a and 302b is same as the spacing 311 between the elements 302b and 302c and the spacing 313 between the elements 302c and 302d. As discussed above, since the signal profile is much stronger at the center of the array, a wider pitch of the non-homogenous sense elements 302 at the center has little impact on the accuracy of the signal profile. Whereas, by reducing the sense element pitch at the edges as shown in FIG. 3 enables profile with finer granularity which significantly improves the accuracy of the signal profile at the edge of the array panel. It is noted that the sense elements 302 may be either one of a transmit (Tx) or receive (Rx) sense elements. Even though, FIG. 3 illustrates a capacitance sense array 300 having only one layer of the non-homogenous sense elements disposed in the horizontal axis, it is noted that the capacitance sense array 300 may include a second layer of non-homogenous sense elements disposed in other longitudinal axis having the similar configuration. Also, even though, FIG. 3 illustrates that the pitches of each of the sense elements decreases as the sense elements are positioned closer towards the edge of the panel, it is noted that the decreasing of the pitches of the sense elements can take any form of granularity.

Figure 4:
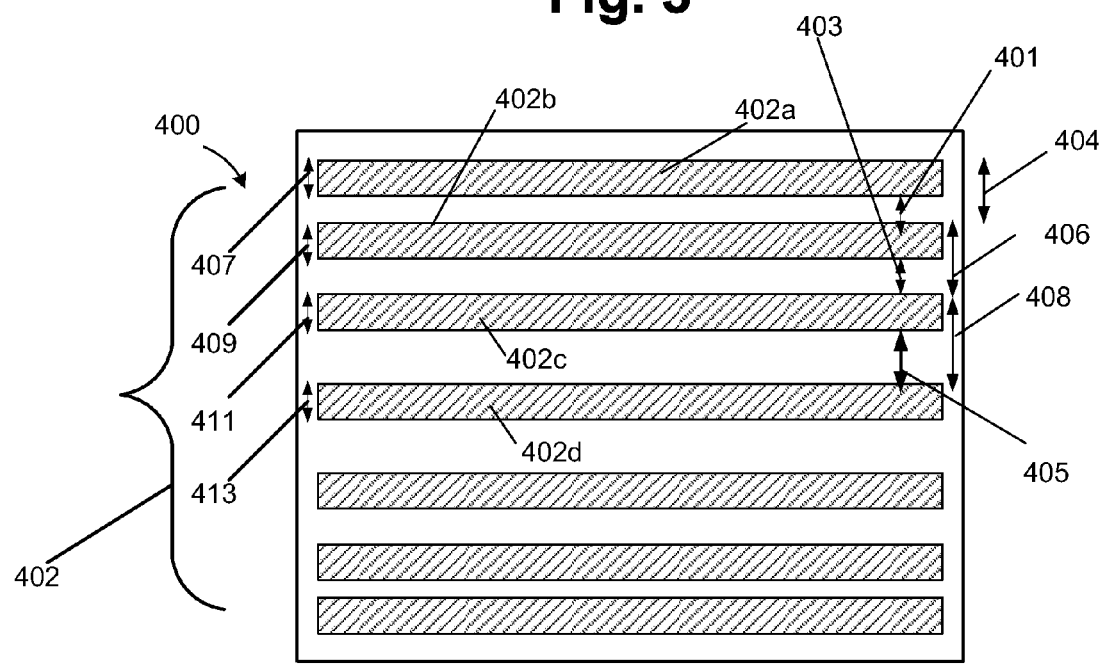
FIG. 4 illustrates a plan view of one embodiment of a capacitive sense array of sense elements having non-homogenous pitches with varied spacing between the sense elements.

FIG. 4 illustrates a plan view of one embodiment of a capacitive sense array 400 of sense elements 402 having non-homogenous pitches disposed in a first longitudinal axis of the capacitance sense array 400. As described above, pitch in the present invention is defined as the width of the sense elements and spacing between the sense elements. As an example, pitch 404 in FIG. 4 is illustrated as the distance from the right edge of the sense element 402a to the same right edge of the sense element 402b. Similarly, pitch 406 is shown as the distance from the right edge of the sense element 402b to the same right edge of the sense element 402c and pitch 408 is shown as the distance from the right edge of sense element 402c to the right edge of the send element 402d. It is noted that the pitch 404 may include the distance from the left edge of the sense element 402a to the same left edge of the sense element 402b. Specifically, the non-homogenous pitch sense elements 402 have constant widths (407, 409, 411 and 413) and are situated in the horizontal axis with the spacing between the non-homogenous pitch sense elements 402 gradually decreasing towards the edges of the capacitive sense array 400. The spacing between the sense elements 402 disposed closer to the edges of the capacitive sense array 400 is smaller while the spacing between the sense elements disposed closer to the center area of the capacitive sense array 400 is comparatively bigger. So, an edge sense element 402a in FIG. 4 is disposed closer to the edge of the capacitive sense array 400; a first inner sense element 402b is disposed closer to the center area of the array 400 than the edge sense element 402a; a second inner sense element 402c disposed closer to the center area of the capacitive sense array 400 than the first inner sense element 402b; and a center sense element 402d disposed at the center area of the capacitive sense array 400. As illustrated in FIG. 4, a first spacing 401 between the edge sense element 402a and the first inner sense element 402b is smaller than a second spacing 403 between the first inner sense element 402b and the second inner sense element 402c. Also, the second spacing 403 is smaller then a third spacing 405 between the second inner sense element 402c and the center sense element 402d. For example in FIG. 4, of the first spacing 401 may be in the range of 10 μm to 40 μm, the second spacing 403 may be in the range of 100 μm to 160 μm and the third spacing 405 may be in the range of 160 μm to 640 μm. Alternatively, other dimensions of the spacing may be used as would be appreciated by one of ordinary skill in the art having the benefit of this disclosure. As discussed above, since the signal profile is much stronger at the center of the array, the spacing between the sense elements 402 closer to the center area of the capacitive sense array 400 has little impact on the accuracy of the signal profile. Whereas, by reducing the spacing between the sense elements 402 closer to the edges of the capacitive sense array 400 as shown in FIG. 4 significantly improve the accuracy of the signal profile at the edge of the array panel. It is noted that the sense elements 402 may be either one of a transmit (Tx) or receive (Rx) sense elements. Even though, FIG. 4 illustrates a capacitive sense array 400 having only one layer of the homogenous sense elements with varied spacing disposed in the horizontal axis, it is noted that the capacitive sense array 400 may include a second layer of sense elements disposed with varied spacing disposed in other longitudinal axis with the same configuration. Also, even though, FIG. 4 illustrates that the spacing between each of the sense elements decreases as the sense elements are positioned towards the edge of the panel, it is noted that the spacing between the sense elements can take any form of granularity.

Figure 5A:
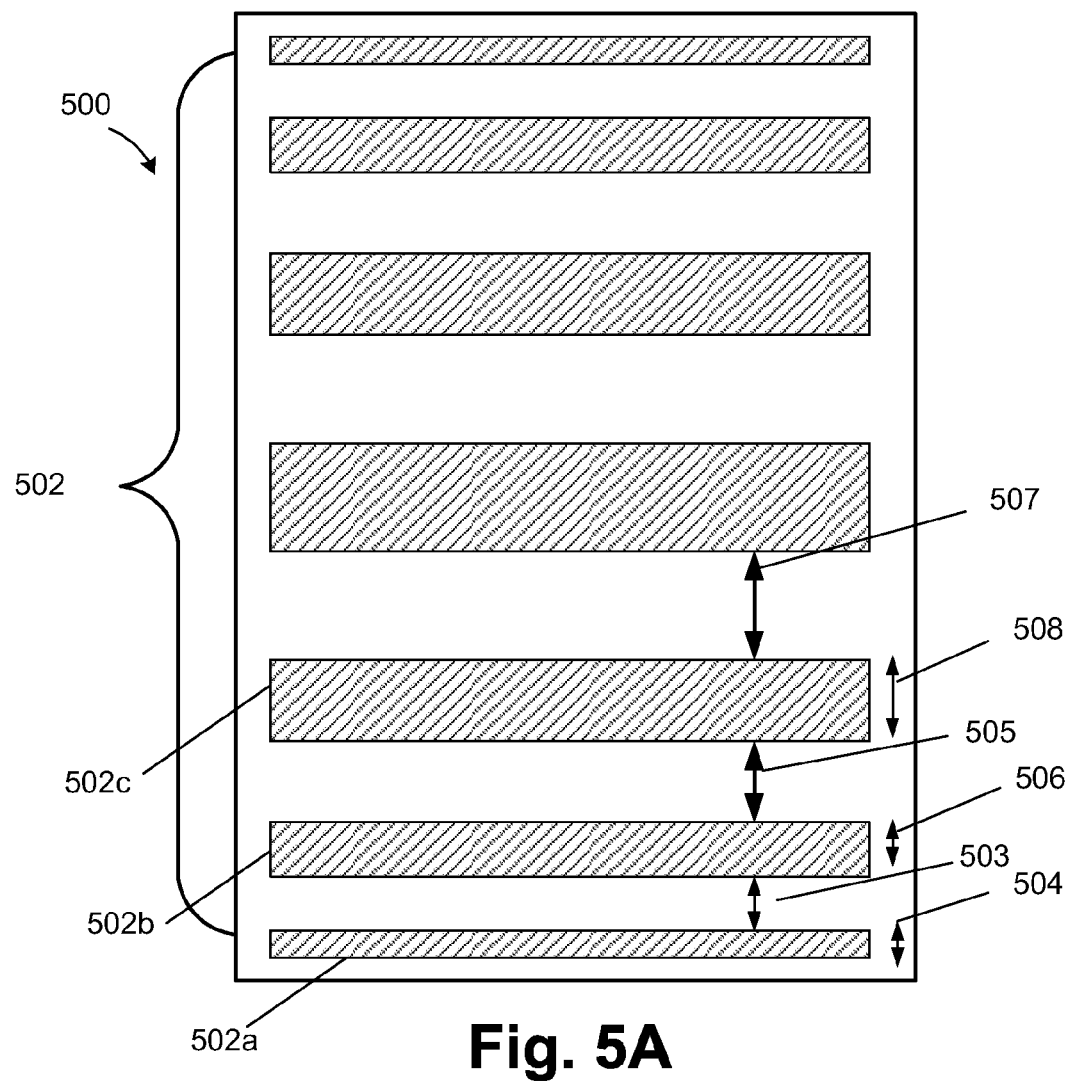
FIG. 5A illustrates a plan view of one embodiment of a capacitive sense array of sense elements having non-homogenous pitches with varied widths of the sense elements and varied spacing between the sense elements.

FIG. 5A illustrates a plan view of one embodiment of a capacitive sense array 500 of sense elements 502 having non-homogenous pitches disposed in a first longitudinal axis of the capacitance sense array 500. The sense elements 502 have both non-homogenous widths and varied spacing between the sense elements 502. Specifically, the sense elements 502 are situated in the horizontal axis and both the widths of the sense elements 502 and the spacing between the sense elements 502 (i.e. sense element pitch) gradually decrease as the sense elements 502 are positioned towards the edges of the capacitance sense array 500. As shown in FIG. 5A, the width of an edge sense element 502a is smaller than the width of a first inner sense element 502b and the width of the first inner sense element 502b is smaller than the width of a second inner sense element 502c. Also, a first spacing 501 between the edge sense element 502a and the first inner sense element 502b is smaller than a second spacing 503 between the first inner sense element 502b and the second inner sense element 502c and so forth. It is noted that sense elements 502 may be either one of a transmit (Tx) or receive (Rx) sense elements. As noted above, the widths of the sense elements and the spacing between them may vary in the range of tenths of μm to hundredths of μm. Alternatively; other dimensions of the widths and spacing may be used as would be appreciated by one of ordinary skill in the art having the benefit of this disclosure. Even though, FIG. 5A illustrates a capacitance sense array 500 having only one layer of the non-homogenous sense elements with varied spacing disposed in the horizontal axis, it is noted that the capacitance sense array 500 may include a second layer of homogenous sense elements disposed with varied spacing disposed in other longitudinal axis with the same configuration. Alternatively, more than two layers may be used as would be appreciated by one of ordinary skill in the art having the benefit of this disclosure. It should also be noted that the sense elements may be disposed in a single layer for both a single dimensional array, as well as for a two dimensional array. In other embodiments, other combination of layers and dimensions may be used as would be appreciated by one of ordinary skill in the art having the benefit of this disclosure.

Figure 5B:
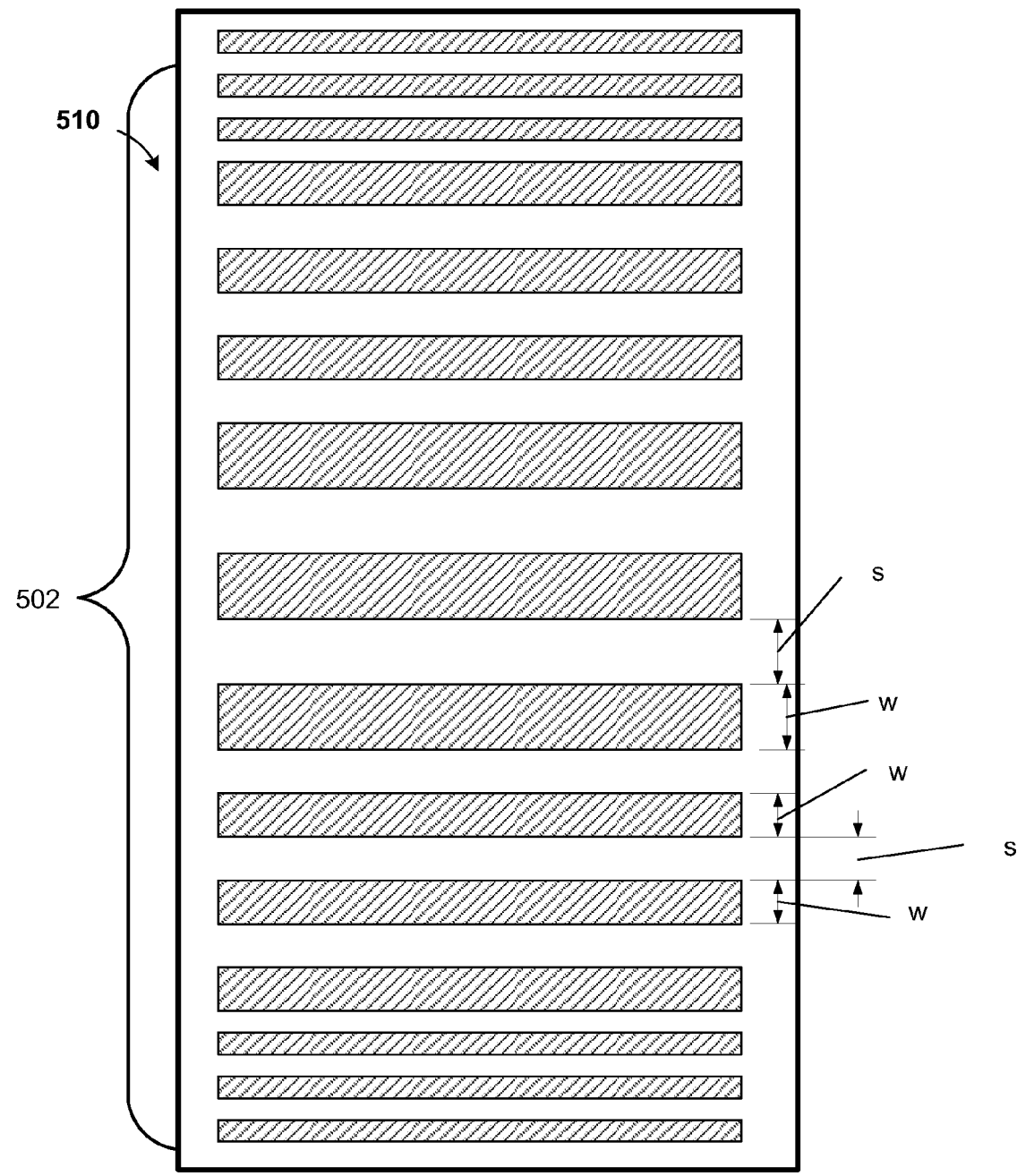
FIG. 5B illustrates a plan view of another embodiment of a capacitive sense array of sense elements having non-homogenous pitches with varied widths of the sense elements and varied spacing between the sense elements.

FIG. 5B illustrates a plan view of another embodiment of a capacitive sense array 510 having non-homogenous width sense elements with varied spacing between the sense elements. As shown in FIG. 5B, both the sense element width w and the spacing s between the sense elements 502 may take any form of granularity. Alternatively, more than two layers may be used as would be appreciated by one of ordinary skill in the art having the benefit of this disclosure. It should also be noted that the sense elements may be disposed in a single layer for both a single dimensional array, as well as for a two dimensional array. In other embodiments, other combination of layers and dimensions may be used as would be appreciated by one of ordinary skill in the art having the benefit of this disclosure.

Figure 6:
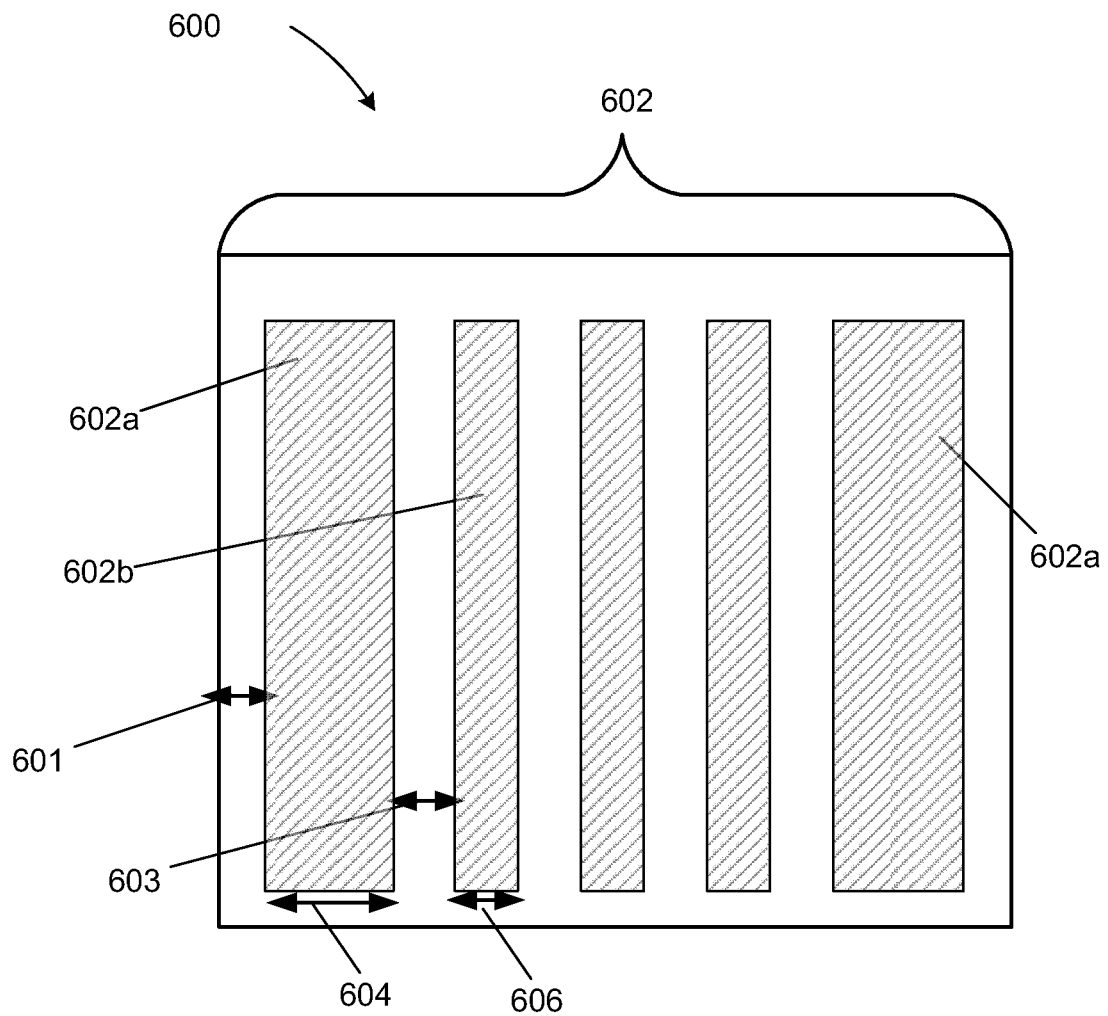
FIG. 6 illustrates a plan view of another embodiment of a capacitive sense array of sense elements having non-homogenous pitches.

FIG. 6 illustrates a plan view of another embodiment of a capacitive sense array 600 of sense elements 602 having non-homogenous pitches. As shown in FIG. 6, the sense elements 602 include non-homogenous widths at the edges and are disposed in a vertical axis of the capacitance sense array 600. Specifically, the edge sense elements 602a are situated in vertical axis and each of the edge sense elements 602a are extended wider to align with each edge of the capacitance sense array 600 as show in FIG. 6. The width 604 of the edge sense element 602a is greater than the width 606 of adjacent sense element 602b. Due to this alignment, a first spacing 601 between the edge sense element 602a and the edge of the capacitance sense array 600 is less than a second spacing 603 between the edge sense element 602a and the adjacent sense element 602c. Thus this alignment of the edge sense elements 602a with the edge of the panel array substantially reduces the spacing at the edges which causes a significant improvement in the accuracy of the signal profile at the edge of the array panel. As an example, the width 606 of the sense element 602b may be about 100 µm and the width 604 of the edge sense element 602a may be about 400 µm. Also, the first spacing 601 may be in the range of tenths of µm and second spacing 603 may be in the range of hundredths of µm. It is noted that in this embodiment, the granularity of the signal profile would remain the same; however, the signal strength improves resulting in better accuracy at the edges of the panel array.

Figure 7:
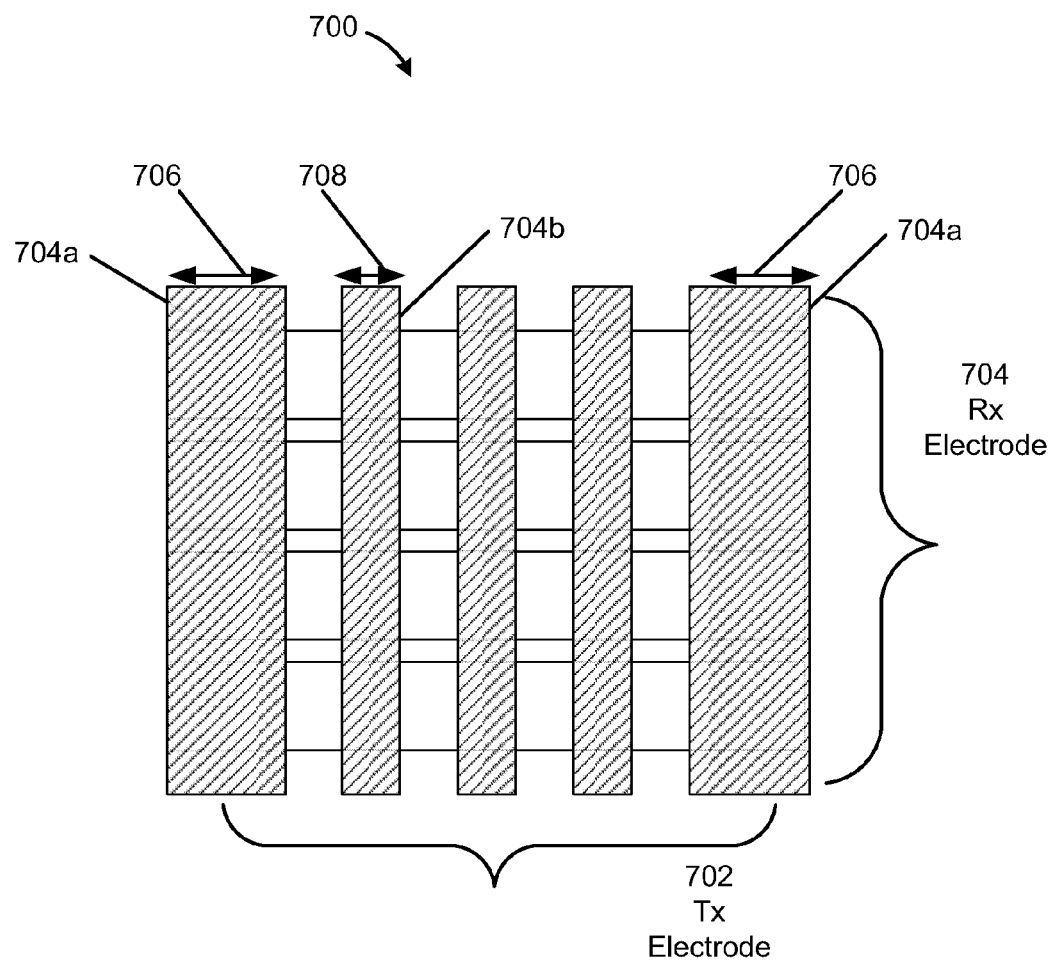
FIG. 7 illustrates a plan view of one embodiment of a mutual capacitive sense array having a combination of sense elements with homogenous pitches and non-homogenous pitches.

FIG. 7 illustrates a plan view of one embodiment of a mutual capacitive sense array 700 having combination of sense elements having homogenous pitches and sense elements having non-homogenous pitches. As shown in FIG. 7, the mutual capacitive sense array 700 includes a 5×5 matrix including a first set of transmit ("Tx") sense elements 702 having homogenous pitches (i.e. homogenous Tx elements) and a second set of receive ("Rx") sense elements 704 having non-homogenous pitches (i.e. non-homogenous Rx elements). Both the transmit and receive sense elements of the 5×5 sense element matrix are arranged so that each of the homogenous transmit sense elements 702 intersects each of the non-homogenous receive sense elements 704. The intersection of the homogenous transmit sense elements 702 and the non-homogenous receive sense elements 704 are referred to as sense elements in a mutual capacitive sense array. In this embodiment, the homogenous Tx sense elements 702 are situated in horizontal axis and the widths of each of the homogenous Tx 702 sense elements are the same. The non-homogenous Rx sense elements 704 are situated in vertical axis and each of the edge non-homogenous Rx sense elements 704a and 704a are extended wider to align with the each end of the homogenous Tx sense elements 702 as shown in FIG. 7. The width 706 of the non-homogenous Rx edge sense element 704a is greater than the width 708 of adjacent non-homogenous Rx sense element 704b. Thus this alignment of the edge Rx sense elements with the Tx sense elements of the panel array substantially reduces a first spacing between the non-homogenous edge Rx sense element 704a and one end of each of the homogenous Tx sense elements. Further this alignment also reduces a second spacing between the non-homogenous edge Rx sense element 704a and other end of each of the homogenous Tx sense elements which causes a significant improvement in the accuracy of the signal profile at the edge of the array panel. As noted above, the widths of the sense elements may vary in the range of tenths of µm to hundredths of µm. Embodiments described herein can be used in any capacitive sense arrays that use other capacitive sensing techniques, such as self-cap sensing as would be appreciated by one of ordinary skill in the art having the benefit of this disclosure.

Figure 8A:
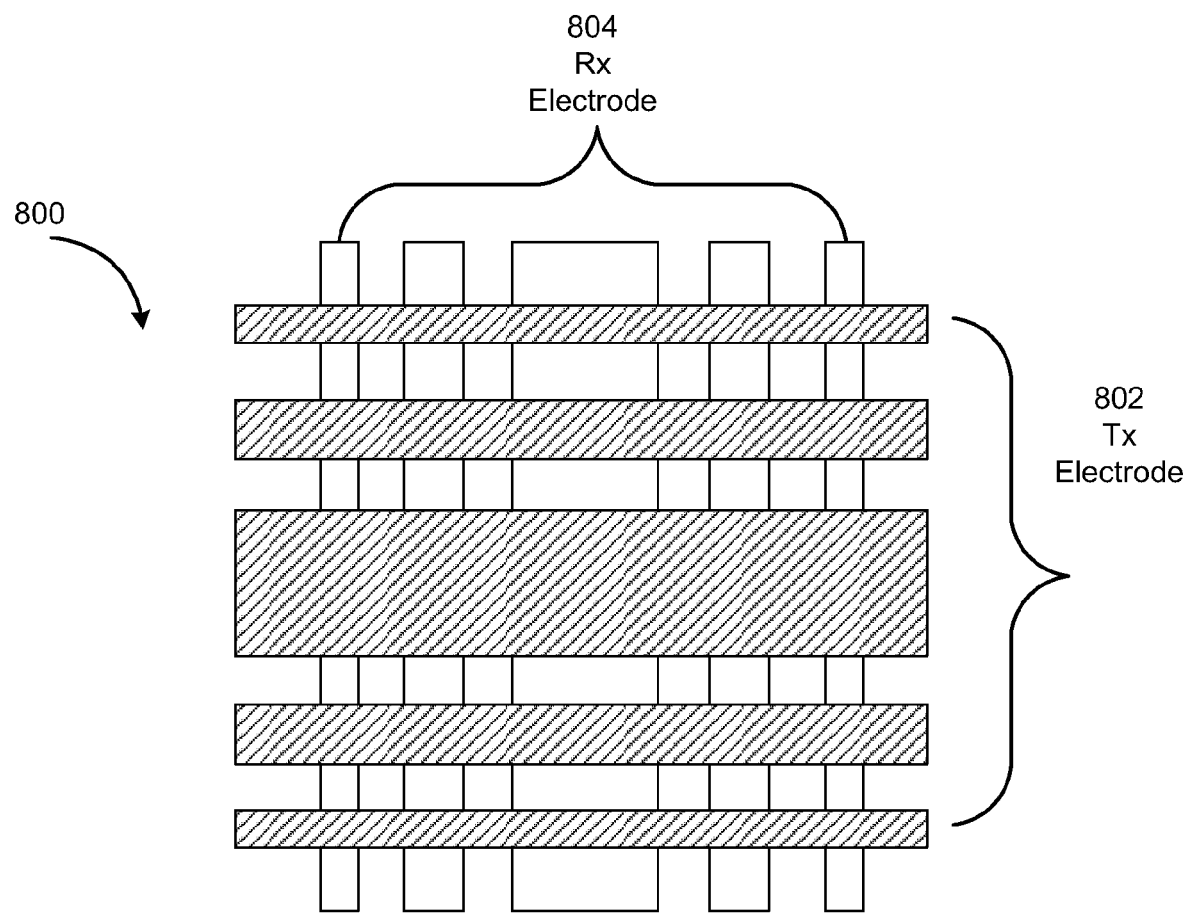
FIG. 8A illustrates a plan view of another embodiment of a mutual capacitive sense array of sense elements having non-homogenous pitches with varied widths of the sense elements.

FIG. 8A illustrates a plan view of another embodiment of a mutual capacitive sense array 800 of sense elements having non-homogenous pitches. As shown in FIG. 8, the mutual capacitive sense array 800 includes 5×5 matrix having a first set of sense elements, i.e. transmit ("Tx") sense elements 802 having non-homogenous pitches and a second set of sense elements, i.e. ("Rx") sense elements 804 having non-homogenous pitches. Both the transmit and receive sense elements 5×5 sense element matrix are arranged so that each of the transmit sense elements intersects each of the receive sense elements. Thus, each transmit sense element is capacitively coupled with each of the receive sense elements. As shown in FIG. 8, the Tx sense elements 802 comprise non-homogenous widths and are disposed in a first longitudinal axis of the mutual capacitance sense array 800. Specifically, the Tx sense elements 802 are situated in the horizontal axis and the widths of the Tx sense elements 802 gradually decrease towards the edges of the mutual capacitance sense array 800. The Tx sense elements 802 positioned closer to the edge of the mutual capacitance sense array 800 have smaller widths (i.e. sense element pitch) while the Tx sense elements 802 positioned closer to the center area have widths comparatively larger in size. Also shown in FIG. 8, the "Rx" sense elements 804 have non-homogenous widths and are disposed in a second longitudinal axis of the capacitance sense array 800. Specifically, the Rx sense elements 804 are situated in the perpendicular axis and the widths of the Rx sense elements 804 also gradually decrease towards the edges of the mutual capacitance sense array 800. Similarly to the Tx sense elements 802, the Rx sense elements 804 positioned closer to the edge of the mutual capacitance sense array 800 have smaller widths (i.e. sense element pitch) while the Rx sense elements 804 positioned closer to the center area have widths comparatively larger in size.

Figures 8B, 8C:
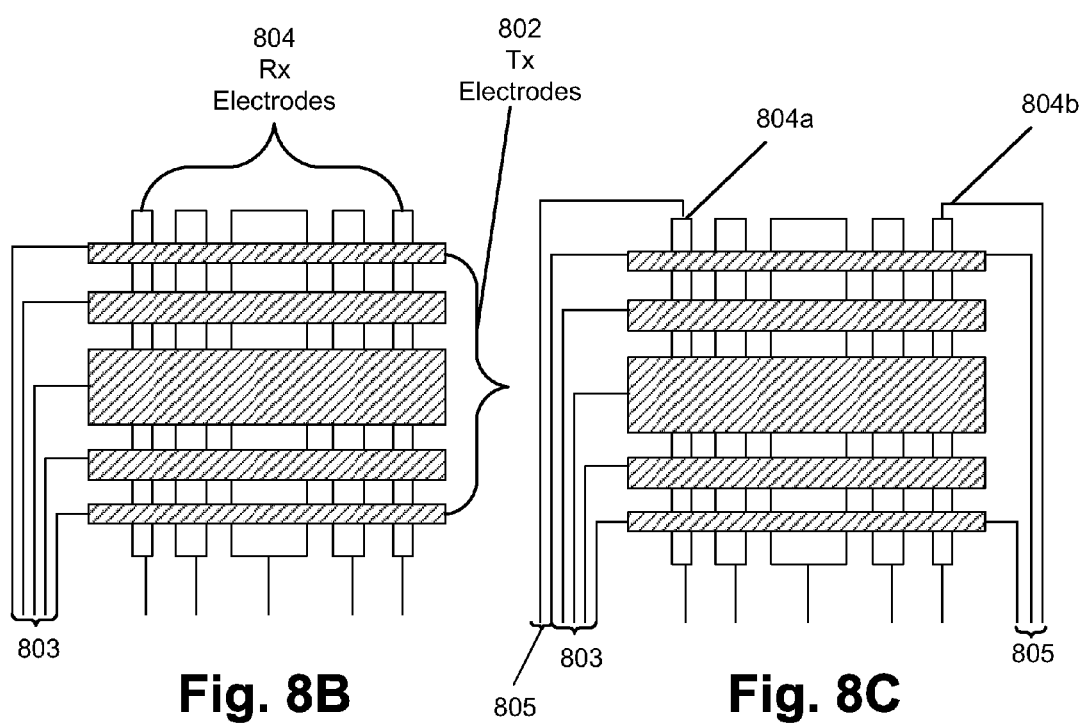
FIG. 8B illustrates a plan view of the mutual capacitive sense array of FIG. 8A with single routing according to one embodiment.
FIG. 8C illustrates a plan view of the mutual capacitive sense array of FIG. 8A with double routing according to another embodiment.

FIG. 8B illustrates a plan view of the mutual capacitive sense array of FIG. 8A with single routing according to one embodiment. In the single routing, only the Tx sense elements 802 are connected with the capacitance sensor 201 (not shown) by conductive traces 803. A Tx signal (not shown) is applied to each of the Tx sense elements 802 and capacitance associated with each Tx sense element 802 is sensed. So, when an object, such as a finger, approaches the mutual capacitance sense 800, the object causes a decrease in capacitance affecting only the Tx sense elements 802. It is noted that the embodiment disclosed in FIG. 8B, the orientation of the axes of Tx sense elements may be switched with the Rx sense elements and a single routing may be connected only to the Rx sense elements as would be appreciated by one of ordinary skill in the art having the benefit of this disclosure.

FIG. 8C illustrates a plan view of the mutual capacitive sense array of FIG. 8A with double routing according to another embodiment. As shown in FIG. 8B, the routing is applied to all the Tx sense elements 802 and only to edge Rx sense element 804 a and the edge Rx sense element 804 b. As known to one skilled in the art, double routing is performed from both ends of the same sense elements effectively cutting the sense elements electrically in half which results in reducing in half both the total resistance and capacitance loading of the sense elements presented to the driver. However, double routing requires extra routing space which can be costly in consumer electronic design and also by further narrowing the sense element width may potentially result in lowering of the signal profile. So, by selectively double routing only at the edge sense elements is both cost effective and also improves sensitivity, resulting in accuracy at the edges of the array panel. As discussed above, the signal profile is much stronger at the center of the array, so an Rx signal (not shown) is only measured at the edge of the Rx sense element 804 a and at the edge of the Rx sense element 804 b via the conductive traces 805. So, for example, if a finger is placed near the intersection of Tx sense element 802 and Rx sense element 804, the presence of finger will decrease the capacitance between the Tx sense element 802 and the Rx sense element 804. This decrease in capacitance is only measured at the edge Rx sense element 804.

It is noted that in the above embodiments, the Figures include stripes, but other shapes may be used such as diamond, hexagons, pentagons, as well as other tessellated shapes as would be appreciated by one of ordinary skill in the art having the benefit of this disclosure.

FIG. 9A-9C illustrate embodiments of assembled layer structures of the mutual capacitive sense array 900. As shown in FIG. 9A, a single glass layer is sputtered with ITO on top and bottom. The top ITO may be a Rx sense element and the bottom ITO may be a Tx sense element. It is noted that the sensor elements are not limited to ITO and may be formed of other optically transmissive conductive materials. As shown in FIG. 9A, an optical clear adhesive (OCA) having a width in the range of 0.05 mm to 0.2 mm lays only on the top ITO. An overlay, such as a polymer or glass having a width in the range of 0.55 mm to 1.1 mm resides on top of the OCA. A display module such as an LCD is placed below the bottom ITO and an air-gap having a width in the range of 0.3 mm to 0.5 mm is placed between the bottom ITO and the LCD to reduce any radiation caused by the LCD. Further, the width from the top sense element to the bottom sense element (including the sensor glass) ranges varies between 0.3 mm to 0.7 mm In FIG. 9B, the sensor glass of FIG. 9A is replaced with a dual layer film having a width in the range of 0.1 mm to 0.18 mm. An OCA having a width in the range of 0.05 mm to 0.2 mm is also placed above the top ITO and an OCA having a width in the range of 0.1 mm to 0.2 mm is placed below the film. An overlay having a width in the range of 0.55 mm to 1.1 mm resides on top of the OCA as shown in FIG. 9B. The bottom ITO has a width in the range of 0.05 mm to 0.18 mm. A display module such as an LCD is placed below the bottom ITO and an air-gap having a width in the range of 0.3 mm to 0.5 mm is placed between the bottom ITO and the LCD to reduce any radiation caused by the LCD. FIG. 9C illustrates the glass film hybrid pattern replacing the glass of FIG. 9A with a single film having a width in the range of 0.1 mm to 0.18 mm. An overlay is placed above the top ITO and the combination of both having a width in the range of 0.55 mm to 1.1 mm. An OCA having a width of approximately 0.2 mm is also placed above the bottom ITO. An air-gap having a width in the range of 0.3 mm to 0.5 mm is placed between the bottom ITO and the LCD to reduce any radiation caused by the LCD. Alternatively, other dimensions of the width may be used as would be appreciated by one of ordinary skill in the art having the benefit of this disclosure.

Figure 10:
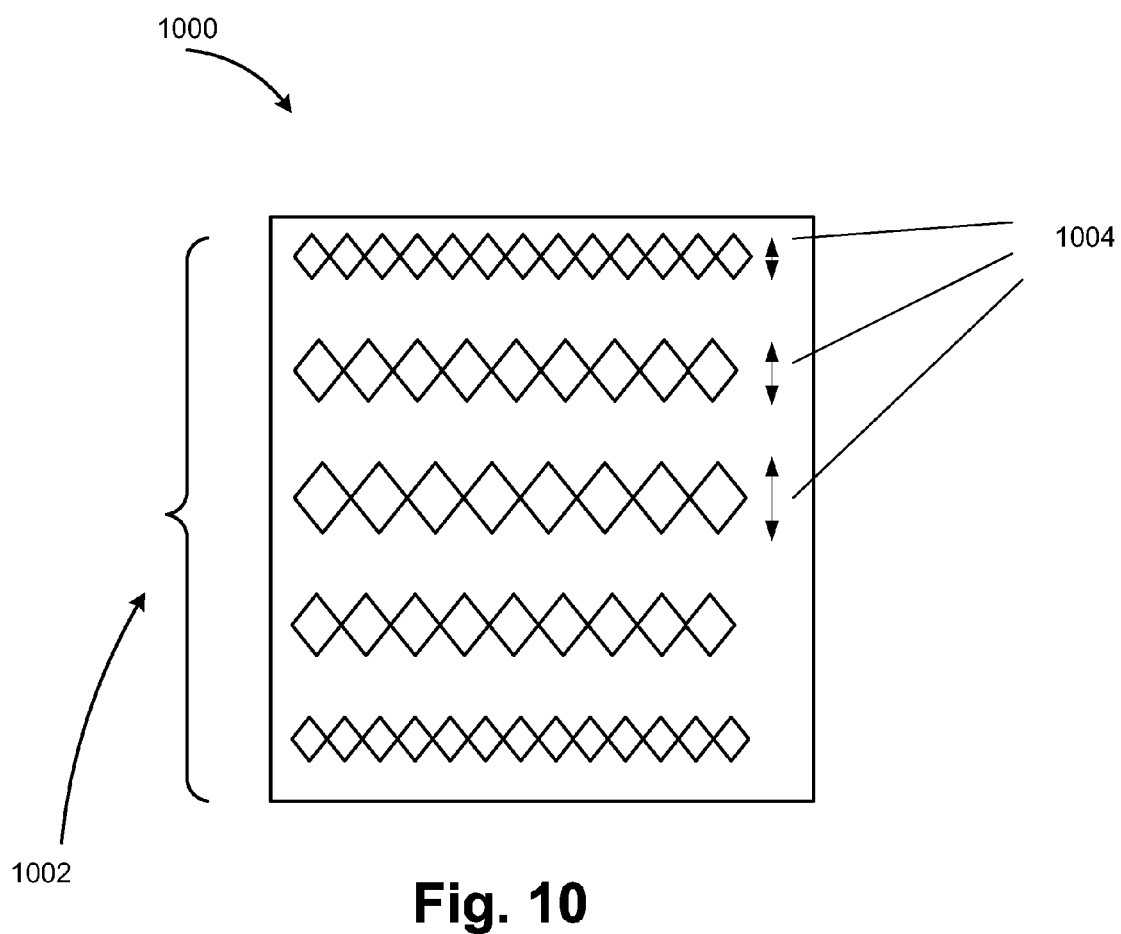
FIG. 10 illustrates a plan view of a capacitive sense array of sense elements having diamond shapes, in accordance with embodiments.

It is noted that in the above embodiments, the orientation of the axes as may be switched configured to other configurations known to one skilled in the art. It is also noted that the sense elements as disclosed in the above embodiments comprise of rectangles, however, one skilled in the art would appreciate that the sense elements may comprise other shapes such as squares, diamonds, circles, or other shapes and configurations as would be appreciated by one of ordinary skill in the art having the benefit of this disclosure. For example, FIG. 10 illustrates an exemplary plan view of capacitive sense array 1000 of sense elements 1002 of diamond shapes having non-homogenous pitches disposed in a first longitudinal axis of the capacitance sense array 1000. As an example illustrated in the embodiment, the widths 1004 of the diamond shaped sense elements 1002 vary and the spacing between the sense elements remain the same.

The particular features, structures or characteristics described herein may be combined as suitable in one or more embodiments of the invention. In addition, while the invention has been described in terms of several embodiments, those skilled in the art will recognize that the invention is not limited to the embodiments described. The embodiments of the invention can be practiced with modification and alteration within the scope of the appended claims. The specification and the drawings are thus to be regarded as illustrative instead of limiting on the invention.

What is claimed is:

1. A capacitive sense array, the array comprising:
a first set of sense elements having a plurality of non-homogenous pitches, the first set of sense elements disposed in a first longitudinal axis of the capacitive sense array, wherein a pitch of a sense element of the first set of sense elements comprises a width of the sense element and a spacing between the sense element and an adjacent sense element of the first set of sense elements, wherein the sense element is not directly coupled to any other of the first sense elements through a conductor, the width of the sense element is different from a width of the adjacent sense element, and spacing between a plurality of sense elements of the first set of sense elements is non-homogenous.

2. The capacitive sense array of claim 1, wherein widths of greater than two of the sense elements are non-homogenous.

3. The capacitive sense array of claim 1, wherein widths of greater than two of the sense elements are non-homogenous.

4. The capacitive sense array of claim 1, wherein the first set of sense elements comprises a first sense element having a pitch smaller than a pitch of another sense element of the first set of sense elements.

5. The capacitive sense array of claim 4, wherein the first sense element is an edge sense element disposed closer to an edge of the capacitive sense array than any other of the sense elements of the first set of sense elements.

6. The capacitive sense array of claim 4, wherein the other sense element of the first set of sense elements is an inner sense element disposed closer to a center of the capacitive sense array than an edge sense element of the first set of sense elements, the edge sense element disposed closer to an edge of the capacitive sense array than the inner sense element.

7. The capacitive sense array of claim 1, further comprising a second set of sense elements disposed in a second longitudinal axis of the capacitive sense array, wherein said second longitudinal axis is perpendicular to the first longitudinal axis.

8. The capacitive sense array of claim 7, further comprising a processing device coupled to the capacitive sense array, wherein the processing device is to detect a presence of a conductive object, the processing device is further to use the first set of non-homogenous pitch sense elements as one of transmission (Tx) sense elements and receive (Rx) sense elements and the second set of sense elements as the other one of the Tx sense elements and the Rx sense elements.

9. A capacitive sense array, the array comprising:
a first set of sense elements having a plurality of non-homogenous first pitches, the first set of sense elements comprised of a conductive material and disposed in a first longitudinal axis of the capacitive sense array, wherein each of the first pitches comprises a first width of one of the sense elements of the first set of sense elements and a first spacing between the one of the sense elements and an adjacent sense element of the first set of sensor elements, wherein the one of the sense elements is not coupled, through the conductive material, to the adjacent sense element, and wherein a spacing between the one of the sense elements and an edge of the capacitive sensor array is smaller than a spacing between at least two of the sense elements of the first set of sense elements; and
a second set of sense elements having non-homogenous second pitches disposed in a second longitudinal axis of the capacitive sense array, wherein the second longitudinal axis is substantially perpendicular to the first longitudinal axis, wherein the second pitch comprises a second width of one of the sense elements of the second set of sense elements and a second spacing between one of the sense elements of the second set of sense elements and an adjacent sense element of the second set of sense elements, wherein each of the sense elements is associated with a separate conductive trace to a sensing circuit.

10. The capacitive sense array of claim 9, wherein the first widths of the first set of sense elements are non-homogenous and the second widths of the second set of sense elements are non-homogenous.

11. The capacitive sense array of claim 9, wherein the first widths of the first set of sense elements are non-homogenous and the second widths of the second set of sense elements are homogenous.

12. The capacitive sense array of claim 9, wherein the spacing between the first set of sense elements is non-homogenous and the spacing between the second set of sense elements is homogenous.

13. The capacitive sense array of claim 9, wherein the spacing between the first set of sense elements is non-homogenous and the spacing between the second set of sense elements is non-homogenous.

14. The capacitive sense array of claim 9, wherein the first set comprises at least a first sense element whose greatest width is smaller than that of at least one of other sense elements of the first set, and wherein the second set comprises at least a second sense element whose greatest width is smaller than that of at least one of other sense elements of the second set.

15. The capacitive sense array of claim 14, wherein the first sense element is a first edge sense element disposed closest to an edge of the capacitive sense array in the first longitudinal axis, and wherein the second sense element is a second edge sense element disposed closest to an edge of the capacitive sense array in the second longitudinal axis.

16. The capacitive sense array of claim 14, wherein the first sense element is a first inner sense element disposed closer to a center of the capacitive sense array than an edge sense element disposed closest to an edge of the capacitive sense array in the first longitudinal axis, and wherein the second sense element is a second inner sense element disposed closer to a center of the capacitive sense array than an edge sense element disposed closest to an edge of the capacitive sense array in the second longitudinal axis.

17. The capacitive sense array of claim 9, further comprising a processing device coupled to the capacitive sense array, wherein the processing device is to detect a presence of a conductive object, the processing device is further to use the first set of non-homogenous pitch sense elements as one of transmission (Tx) sense elements and receive (Rx) sense elements and the second set of non-homogenous pitch sense elements as the other one of the Tx sense elements and the Rx sense elements.

* * * * *